(12) United States Patent
Lee et al.

(10) Patent No.: US 7,615,421 B2
(45) Date of Patent: Nov. 10, 2009

(54) METHOD FOR FABRICATING THIN FILM TRANSISTOR

(75) Inventors: Sang-Woong Lee, Seoul (KR); Jae-Young Oh, Suwon-si (KR); Tae-Hoon Yang, Seongnam-si (KR); Jin-Wook Seo, Suwon-si (KR); Ki-Yong Lee, Yongin-si (KR); Cheol-Ho Yu, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 592 days.

(21) Appl. No.: 11/011,585

(22) Filed: Dec. 15, 2004

(65) Prior Publication Data

US 2006/0046357 A1    Mar. 2, 2006

(30) Foreign Application Priority Data

Aug. 24, 2004    (KR)    ............... 10-2004-0066931

(51) Int. Cl.
    *H01L 21/84*    (2006.01)
(52) U.S. Cl. ............... 438/151; 438/150; 438/156; 438/585; 438/685; 438/687; 438/763; 438/791
(58) Field of Classification Search ............... 438/149, 438/150, 151, 166, 585, 660, 685–687, 761.763, 438/778, 791, 902, FOR. 184, FOR. 395, 438/FOR. 405, 156, 761, 763
See application file for complete search history.

(56) References Cited

U.S. PATENT DOCUMENTS 5,529,937 A    6/1996    Zhang

| | | | |
|---|---|---|---|
| 2003/0104232 A1* | 6/2003 | Kihara et al. | 428/473.5 |
| 2004/0144986 A1* | 7/2004 | Chen et al. | 257/94 |
| 2004/0227459 A1* | 11/2004 | Imura | 313/504 |
| 2004/0259326 A1* | 12/2004 | Hideo | 438/458 |
| 2005/0062118 A1* | 3/2005 | Yaung et al. | 257/414 |
| 2005/0074930 A1* | 4/2005 | Chen et al. | 438/151 |
| 2006/0102902 A1* | 5/2006 | Lee et al. | 257/66 |

FOREIGN PATENT DOCUMENTS

| | | |
|---|---|---|
| JP | 07-307286 | 11/1995 |
| JP | 08-097137 | 4/1996 |
| JP | 09-153457 | 6/1997 |
| JP | 11-251241 | 9/1999 |
| JP | 2001-126329 | 5/2001 |
| JP | 2001-267240 | 9/2001 |
| KR | 10-0209198 | 4/1999 |
| KR | 1020030060403 | 7/2003 |

* cited by examiner

*Primary Examiner*—N Drew Richards
*Assistant Examiner*—Joannie A Garcia
(74) *Attorney, Agent, or Firm*—H.C. Park & Associates, PLC

(57) ABSTRACT

The present invention relates to a method for fabricating thin film transistor, more particularly, to a method for fabricating thin film transistor which not only manufactures a polycrystalline silicon layer having large grain size and containing a trace of residual metal catalyst by heat treating thereby crystallizing the metal catalyst layer after forming an amorphous silicon layer on a substrate, forming a capping layer formed of nitride film having 1.78 to 1.90 of the refraction index when crystallizing the amorphous silicon layer and forming a metal catalyst layer on the capping layer, but also controls characteristics of the polycrystalline silicon layer by controlling the refraction index of the capping layer.

20 Claims, 3 Drawing Sheets

METHOD FOR FABRICATING THIN FILM TRANSISTOR

CROSS REFERENCE

This application claims the benefit of Korean Patent Application No. 2004-66931, filed on Aug. 24, 2004, the disclosure of which is hereby incorporated herein by reference in its entirety.

BACKGROUND OF THE INVENTION (a) Field of the invention

The present invention relates to a method for fabricating thin film transistor, more particularly, to a method for fabricating thin film transistor which not only manufactures a polycrystalline silicon layer having large grain size and containing a trace of residual metal catalyst by heat treating thereby crystallizing the metal catalyst layer after forming an amorphous silicon layer on a substrate, forming a capping layer formed of nitride film having 1.78 to 1.90 of the refraction index when crystallizing the amorphous silicon layer and forming a metal catalyst layer on the capping layer, but also controls characteristics of the polycrystalline silicon layer by controlling the refraction index of the capping layer.

(b) Description of Related Art

In a thin film transistor used in display devices, a semiconductor layer is generally formed by crystallizing the dehydrogenated amorphous silicon layer after depositing amorphous silicon on a transparent substrate such as glass or quartz and dehydrogenating the amorphous silicon layer.

A semiconductor layer composing source, drain and channel region of the thin film transistor is formed by depositing an amorphous silicon layer on a transparent substrate such as glass by using chemical vapor deposition method. However, silicon directly deposited on a substrate by methods such as chemical vapor deposition method has low electron mobility by forming an amorphous silicon layer containing about 12% of hydrogen content, and the silicon layer is damaged by burst of hydrogen contained in the silicon layer when crystallizing the amorphous silicon layer into a crystalline silicon layer having high electron mobility by heat treating the amorphous silicon layer having low electron mobility. The dehydrogenation process is proceeded to prevent burst phenomena of hydrogen generated during crystallization, wherein the dehydrogenation process is performed by heat treating the amorphous silicon layer generally in a furnace at temperature of about 400° C. or more for several minutes to several hours. After performing the dehydrogenation process, the crystallization process for crystallizing the dehydrogenated amorphous silicon layer is executed.

Methods for crystallizing the amorphous silicon layer into a polycrystalline silicon layer include solid phase crystallization method, excimer laser crystallization method, metal induced crystallization method and metal induced lateral crystallization method, wherein the solid phase crystallization method is a method for annealing an amorphous silicon layer for several hours to tens of hours at temperature of about 700° C. or less, that is, a deformation temperature of glass for forming a substrate of display device in which thin film transistor is used, the excimer laser crystallization method is a method for crystallizing the silicon layer by injecting an excimer laser into silicon layer, thereby partially heating the silicon layer to a high temperature for a very short time, the metal induced crystallization method is a method for using a phenomenon in which phase transition of amorphous silicon layer into polycrystalline silicon layer is induced by the metal by contacting metals such as nickel, palladium, gold and aluminum with amorphous silicon layer or injecting the metals into the amorphous silicon layer, and the metal induced lateral crystallization method is a method for crystallizing silicon layer by using a method for sequentially inducing crystallization of silicon as silicide produced by reacting metals and silicon is being laterally spread continuously.

However, the solid phase crystallization method has demerits that deformation of substrate is easily generated since process time is too long, and heat treatment is performed at high temperature for long time, the excimer laser crystallization method has demerits that an expensive laser equipment is required, and protrusions are formed on the surface of polycrystalline silicon layer so that characteristics of interface between semiconductor layer and gate insulation film are deteriorated, and the metal induced crystallization method and the metal induced lateral crystallization method have demerits that a large amount of metal catalyst is remained on polycrystalline silicon layer crystallized so that leakage current of semiconductor of thin film transistor is increased.

SUMMARY OF THE INVENTION

Therefore, in order to solve the foregoing demerits and problems of the prior art, it is an object of the present invention to provide a method for fabricating thin film transistor which not only manufactures a polycrystalline silicon layer having large grain size and containing a trace of residual metal catalyst by heat treating thereby crystallizing the metal catalyst layer after forming an amorphous silicon layer on a substrate, forming a capping layer formed of nitride film having 1.78 to 1.90 of the refraction index when crystallizing the amorphous silicon layer and forming a metal catalyst layer on the capping layer, but also controls characteristics of the polycrystalline silicon layer by controlling the refraction index of the capping layer.

In order to achieve the foregoing object, the present invention provides a method for fabricating thin film transistor comprising the steps of preparing an insulation substrate; forming an amorphous silicon layer on the substrate; forming a capping layer having 1.78 to 1.90 of the refraction index on the amorphous silicon layer; forming a metal catalyst layer on the capping layer; and crystallizing the amorphous silicon layer into a polycrystalline silicon layer by heat treating the substrate.

Furthermore, the present invention provides a method for fabricating thin film transistor further comprising the steps of removing the capping layer; forming a semiconductor layer by patterning the polycrystalline silicon layer; and forming gate insulation film, gate electrode, interlayer insulation film and source/drain electrodes on the substrate after the step of crystallizing the amorphous silicon layer into the polycrystalline silicon layer by heat treating the substrate.

BRIEF DESCRIPTION OF THE DRAWINGS

The above and other features and advantages of the present invention will become more apparent to those of ordinary skill in the art by describing in detail preferred embodiments thereof with reference to the attached drawings in which.

EXPLANATION OF MARKS FOR PRINCIPAL PARTS OF DRAWINGS

---

Figure 1A:
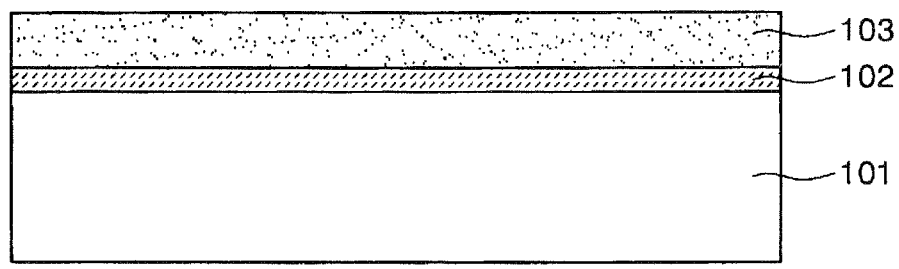
FIG. 1a to FIG. 1c are cross sectional views of a process of crystallizing an amorphous silicon layer into a polycrystalline silicon layer by the present invention.

103: amorphous silicon layer
104: capping layer
105: metal catalyst layer
106: heat treatment
108: seed
109: polycrystalline silicon layer

---

DETAILED DESCRIPTION OF THE INVENTION

The present invention will now be described in detail in connection with preferred embodiments with reference to the accompanying drawings. For reference, like reference characters designate corresponding parts throughout several views.

Figure 1B:
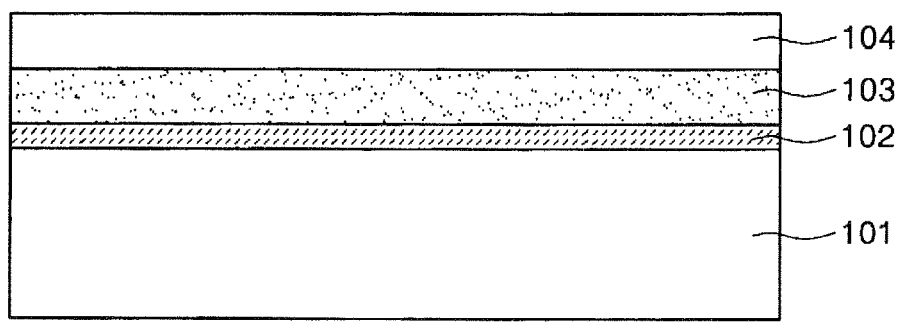
Figure 1C:
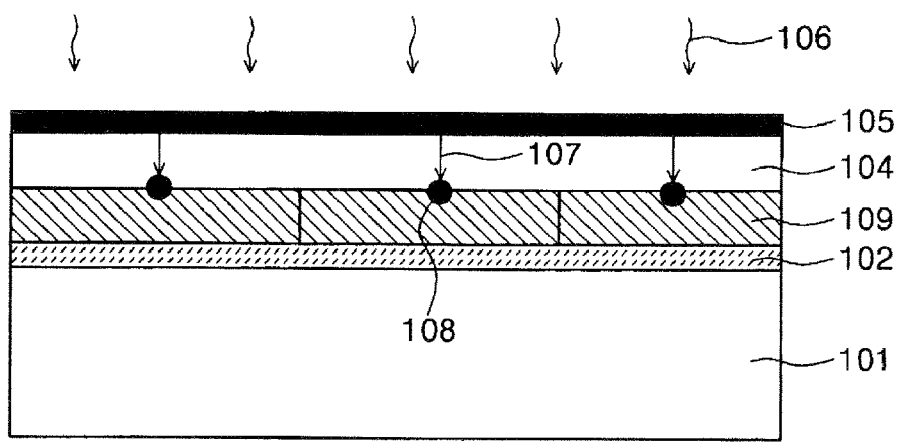

FIG. 1a to FIG. 1c are cross sectional views of a process of crystallizing an amorphous silicon layer into a polycrystalline silicon layer by the present invention.

First, FIG. 1a is a cross sectional view of a process of forming a buffer layer on a substrate and forming an amorphous silicon layer on the buffer layer. As illustrated in FIG. 1a, a buffer layer 102 as a single layer or double layer of silicon oxide film or nitride film is formed on an insulation substrate 101 such as plastic or glass by chemical vapor deposition method or physical vapor deposition method, wherein the buffer layer plays a role of preventing diffusion of moisture or impurities generated from a lower part of the substrate or controlling transfer rate of heat during crystallization so that a semiconductor layer is well crystallized.

Subsequently, an amorphous silicon layer 103 is formed on the buffer layer, wherein a dehydrogenation process is proceeded to prevent hydrogen from remaining in the amorphous silicon layer by performing dehydrogenation treatment since the amorphous silicon layer is generally formed by chemical vapor deposition method, the amorphous silicon layer formed by the chemical vapor deposition method contains gas such as hydrogen, and the gas causes problems including reduction of electron mobility.

Next, FIG. 1b is a cross sectional view of process of forming a capping layer on the substrate. As illustrated in FIG. 1b, a capping layer 104 is formed on a substrate on which an amorphous silicon layer is formed, wherein the capping layer is formed of a silicon nitride film by chemical vapor deposition method.

Characteristics of the capping layer are changed by various process conditions of the chemical vapor deposition method, and change of the characteristics greatly has a great influence on diffusion or infiltration of metal catalyst in the succeeding processes as well as crystallization of the amorphous silicon layer.

That is, characteristics of the capping layer can be changed by changing important variables when forming the capping layer by chemical vapor deposition, i.e., flux of silane gas, flux of ammonia gas and power.

The capping layer is formed to thickness of 100 to 1500 Å.

FIG. 1c is a cross sectional view of process of forming metal catalyst layer on the capping layer. As illustrated in FIG. 1c, a metal catalyst layer 105 is formed by depositing metal catalyst on the capping layer.

A crystallization method comprising the steps of forming a capping layer on an amorphous silicon layer, forming a metal catalyst layer on the capping layer, forming a seed by heat treating the metal catalyst layer to move the metal catalyst to an interface between the amorphous silicon layer and the capping layer, and crystallizing the amorphous silicon layer into a polycrystalline silicon layer using the seed is called as a super grain silicon crystallization method.

The capping layer is defined as an insulation film for controlling amount or concentration of the metal catalyst contributing to crystallization by controlling diffusion or infiltration of the metal catalyst during heat treatment process.

A metal catalyst layer having surface density of $10^{11}$ to $10^{15}$ atoms/cm$^2$ is formed by depositing any one or more of metal catalysts selected from Ni, Pd, Ti, Ag, Au, Al, Sn, Sb, Cu, Co, Mo, Tr, Ru, Rh, Cd and Pt on the capping layer, wherein the metal catalyst layer is preferably formed of nickel (Ni) since the amorphous silicon layer is easily crystallized into a polycrystalline silicon layer in case that the metal catalyst layer is formed of the nickel.

Subsequently, a process of crystallizing the amorphous silicon layer by heat treating the substrate is proceeded, wherein the heat treatment process comprises first heat treatment process of forming a seed 108 of crystallization by heat treating the metal catalyst layer in the temperature range of 200 to 600° C., thereby diffusing or infiltrating metal catalyst in the metal catalyst layer into capping layer so that the metal catalyst is moved to an interface between the capping layer and the amorphous silicon layer, and second heat treatment process of heat treating the amorphous silicon layer in the temperature range of 400 to 1300° C. so that the amorphous silicon layer is crystallized into a polycrystalline silicon layer 109 by the seed existing on the interface between the capping layer and the amorphous silicon layer.

Size and uniformity of grains of the polycrystalline silicon layer are determined according to forming position or density of the seed, wherein the position or density of the seed is not irrelevant to characteristics of the capping layer and surface density of the metal catalyst layer. However, there is a limit in controlling the surface density of the metal catalyst layer because of limitations of an evaporation apparatus.

Therefore, grain size and uniformity of the polycrystalline silicon layer can be directly controlled by controlling characteristics of the capping layer, thereby controlling forming position or density of the seed. Particularly, characteristics of the capping layer are controlled by controlling the process conditions of the chemical vapor deposition method as described in FIG. 1b, wherein results of the crystallization process are recorded in Table 1 after forming a capping layer by changing the process conditions, and proceeding a crystallization process on the capping layer.

TEST EXAMPLE 1

It could be seen that refraction index of the capping layer was 1.858 when forming a capping layer that was a nitride film as a buffer layer on the amorphous silicon layer using chemical vapor deposition method under the process conditions that process power was 1700 W and a ratio of ammonia (NH$_3$) gas to silane (SiH$_4$) gas was 20/1 after forming an amorphous silicon layer on an insulation substrate as described in the above FIG. 1a and FIG. 1b.

TEST EXAMPLE 2

It could be seen that refraction index of the capping layer was 1.827 when forming a capping layer that was a nitride film as a buffer layer on the amorphous silicon layer using chemical vapor deposition method under the process conditions that process power was 1700 W and a ratio of ammonia gas to silane gas was 40/1 after forming an amorphous silicon layer on an insulation substrate as described in the above FIG. 1a and FIG. 1b.

TEST EXAMPLE 3

It could be seen that refraction index of the capping layer was 1.783 when forming a capping layer that was a nitride film as a buffer layer on the amorphous silicon layer using chemical vapor deposition method under the process conditions that process power was 1700 W and a ratio of ammonia gas to silane gas was 80/1 after forming an amorphous silicon layer on an insulation substrate as described in the above FIG. 1a and FIG. 1b.

TEST EXAMPLE 4

It could be seen that refraction index of the capping layer was 1.832 when forming a capping layer that was a nitride film as a buffer layer on the amorphous silicon layer using chemical vapor deposition method under the process conditions that process power was 700 W and a ratio of ammonia gas to silane gas was 20/1 after forming an amorphous silicon layer on an insulation substrate as described in the above FIG. 1a and FIG. 1b.

TEST EXAMPLE 5

It could be seen that refraction index of the capping layer was 1.815 when forming a capping layer that was a nitride film as a buffer layer on the amorphous silicon layer using chemical vapor deposition method under the process conditions that process power was 700 W and a ratio of ammonia gas to silane gas was 40/1 after forming an amorphous silicon layer on an insulation substrate as described in the above FIG. 1a and FIG. 1b.

TEST EXAMPLE 6

It could be seen that refraction index of the capping layer was 1.824 when forming a capping layer that was a nitride film as a buffer layer on the amorphous silicon layer using chemical vapor deposition method under the process conditions that process power was 700 W and a ratio of ammonia gas to silane gas was 80/1 after forming an amorphous silicon layer on an insulation substrate as described in the above FIG. 1a and FIG. 1b.

TEST EXAMPLE 7

It could be seen that refraction index of the capping layer was 1.861 when forming a capping layer that was a nitride film as a buffer layer on the amorphous silicon layer using chemical vapor deposition method under the process conditions that process power was 1700 W and a ratio of ammonia gas to silane gas was 5/1 after forming an amorphous silicon layer on an insulation substrate as described in the above FIG. 1a and FIG. 1b.

COMPARATIVE EXAMPLE 1

It could be seen that refraction index of the capping layer was 1.908 when forming a capping layer that was a nitride film as a buffer layer on the amorphous silicon layer using chemical vapor deposition method under the process conditions that process power was 700 W and a ratio of ammonia gas to silane gas was 5/1 after forming an amorphous silicon layer on an insulation substrate as described in the above FIG. 1a and FIG. 1b.

As results of the foregoing test example 1 to test example 7 and comparative example 1, it can be seen that refraction ratios of 1.858, 1.827 and 1.783 are gradually decreased as ratios of ammonia gas/silane gas of 20/1, 40/1 and 80/1 are being increased when the process power is constantly 1700 W as described in the test example 1 to test example 3, and the refraction ratios of 1.832, 1.815 and 1.824 tend to be decreased also as the process power is constantly maintained to 700 W and the ratios of ammonia gas/silane gas of 20/1, 40/1 and 80/1 are being increased as described in the test example 4 to test example 6, wherein although refraction index of the test example 6 is increased, it seems that the increase of the refraction index is an error caused by low process power.

Therefore, it can be seen that the more a ratio of ammonia gas to silane gas is increased, the more a refraction index of the capping layer is decreased.

Furthermore, it can be seen that refraction index of the capping layer is increased in a test example having a large process power in the same ratio of ammonia gas to silane gas when comparing the test example 1 to the test example 3 with the test example 4 to the test example 6 at the same time.

Figure 2:
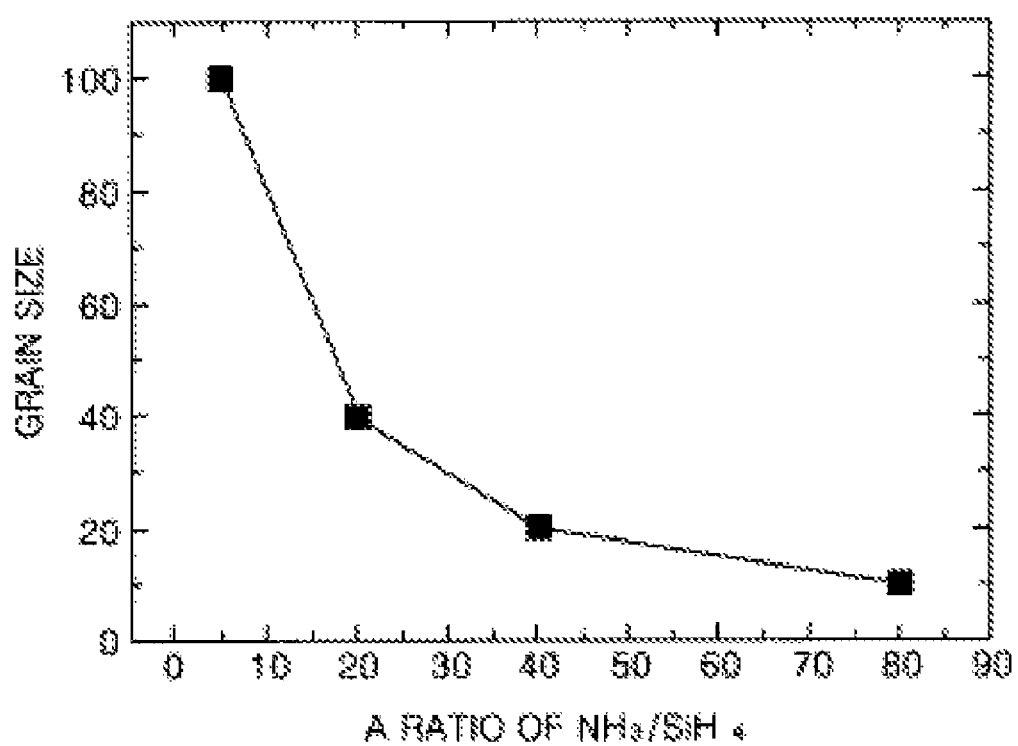
FIG. 2 is a graph for showing size of grains according to a ratio of ammonia gas to silane gas.

The measurement results are shown as a graph of FIG. 2 after forming a polycrystalline silicon layer by proceeding crystallization in the same manner as described in FIG. 1c and measuring size of grains of the polycrystalline silicon layer after forming a capping layer under the same process conditions as in the test example 1 to the test example 3 and the test example 7. As illustrated in FIG. 2, it can be seen that size of the grains of the polycrystalline silicon layer is increased as a ratio of ammonia gas to silane gas is decreased from 80/1 to 5/1, wherein refraction index of the capping layer is decreased if the ratio of ammonia gas to silane gas is decreased when comparing the test example 1 to the test example 3 and the test example 7 with FIG. 2. That is, the more refraction index of the capping layer is decreased, the more size of grains of the polycrystalline silicon layer is increased.

Therefore, it can be seen that size of grains is increased as refraction index of 1.78 to 1.9 is increased to 1.90, and crystallization is not performed in the refraction index range of 1.90 to 1.908. That is, size of grains is decreased too much if refraction index of the capping layer is less than 1.78, and it is not preferable that the refraction index of the capping layer is 1.90 or more to perform the crystallization process since the amorphous silicon layer is not formed in case of proceeding the crystallization process using a capping layer formed by the test example 8.

Therefore, in case of forming a capping layer formed of a silicon nitride film in the super grain silicon crystallization method, a polycrystalline silicon layer having desired grain size and uniformity can be manufactured when forming the capping layer by selecting a proper refraction index value in the range of 1.78 to 1.90.

As described in the above, the lower a ratio of ammonia gas to silane gas is and the higher process power is, the more refraction index is increased since a ratio of silicon in the capping layer is increased, and forming density of the seed formed on the interface between the capping layer and the amorphous silicon layer is lowered so that size and uniformity of the grains are increased since the ratio of the silicon is increased so that it is difficult to diffuse and infiltrate into the capping layer.

TABLE 1

| Test Example | Process power (W) | Ratio of ammonia gas to silane gas | Refraction index |
|---|---|---|---|
| 1 | 1700 | 20 | 1.858 |
| 2 | 1700 | 40 | 1.827 |
| 3 | 1700 | 80 | 1.783 |
| 4 | 700 | 20 | 1.832 |
| 5 | 700 | 40 | 1.815 |
| 6 | 700 | 80 | 1.824 |
| 7 | 1700 | 5 | 1.861 |
| Comparative Example 1 | 700 | 5 | 1.908 |

Figure 3A:
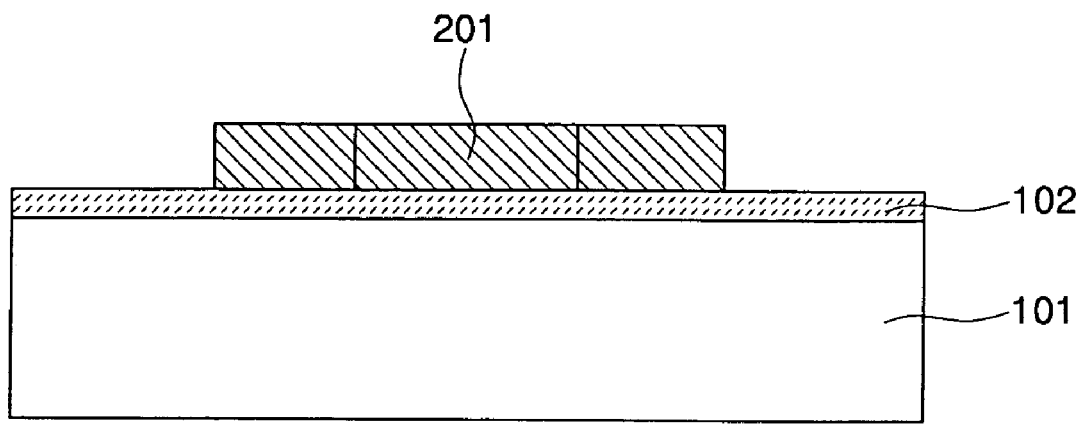
FIG. 3a and FIG. 3b are cross sectional views of a process of fabricating thin film transistor using a polycrystalline silicon layer formed by a method for fabricating thin film transistor according to the present invention.
Figure 3B:
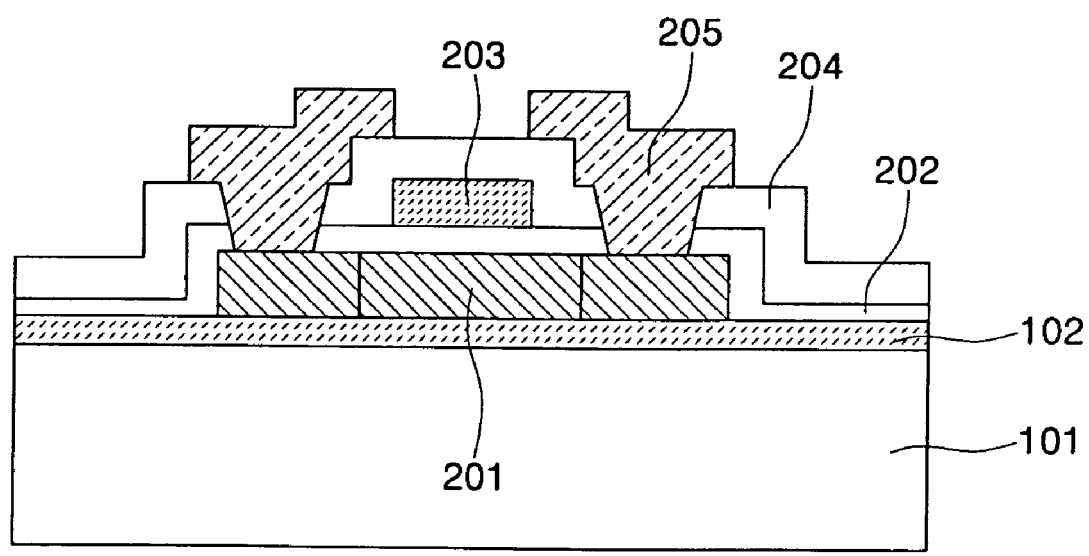

FIG. 3a and FIG. 3b are cross sectional views of a process of fabricating thin film transistor using a polycrystalline silicon layer formed by the foregoing method.

First, FIG. 3a is a cross sectional view of a process of forming a semiconductor layer after removing the metal catalyst layer and the capping layer. As shown in FIG. 3a, a semiconductor layer 201 is formed by patterning the polycrystalline silicon layer after removing the metal catalyst layer and the capping layer existing on a substrate after finishing the crystallization process.

Next, FIG. 3b is a cross sectional view of a process of forming gate insulation film, gate electrode, interlayer insulation film and source/drain electrodes on the semiconductor layer.

A single layer or double layer of gate insulation film 202 formed of silicon oxide film or silicon nitride film is formed on the semiconductor layer formed substrate after forming the semiconductor layer on the substrate.

A gate electrode 203 is formed by depositing a gate electrode forming material on the substrate and patterning the gate electrode forming material after forming the gate insulation film.

Then, contact holes are formed by partially etching the interlayer insulation film and the gate insulation film to partially expose the semiconductor layer after forming an interlayer insulation film 204 for insulating and protecting elements in upper and lower parts of the interlayer insulation film on the substrate.

After forming the contact holes, a thin film transistor is completed by forming source/drain electrode forming materials for filling the contact holes on the whole surface of the substrate and patterning the source/drain electrode forming materials, thereby forming source/drain electrodes 205.

Therefore, when performing crystallization by super grain silicon crystallization method, a method for fabricating thin film transistor according to the present invention is capable of fabricating a thin film transistor in which electron mobility is increased and amount of residual metal catalyst is decreased to lower leakage current by controlling refraction index of capping layer that is a nitride film to 1.78 to 1.90, thereby obtaining a semiconductor layer having large grain size, and which has superior characteristics and is capable of controlling the characteristics by controlling grain size of polycrystalline silicon layer using the refraction index of the capping layer, thereby obtaining the polycrystalline silicon layer having desired grain size and uniformity.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating thin film transistor comprising the steps of:
preparing an insulation substrate;
forming an amorphous silicon layer on the substrate;
forming a capping layer having 1.78 to 1.90 of a refraction index on the amorphous silicon layer;
forming a metal catalyst layer only on an upper surface of the capping layer; and
crystallizing the amorphous silicon layer into a polycrystalline silicon layer by heat treating the substrate,
wherein the method further comprises the steps of removing the capping layer; forming a semiconductor layer by patterning the polycrystalline silicon layer; and forming a gate insulation film, a gate electrode, an interlayer insulation film and source/drain electrodes on the substrate after the step of crystallizing the amorphous silicon layer into the polycrystalline silicon layer by heat treating the substrate.

2. The method for fabricating thin film transistor according to claim 1,
wherein the step of forming the metal catalyst layer on the capping layer is a step of depositing one or more of metal catalysts selected from Ni, Pd, Ti, Ag, Au, Al, Sn, Sb, Cu, Co, Mo, Tr, Ru, Rh, Cd and Pt on the capping layer.

3. The method for fabricating thin film transistor according to claim 1,
wherein the step of forming the metal catalyst layer on the capping layer is a step of forming the metal catalyst layer to an areal density of $10^{11}$ to $10^{15}$ atoms/cm$^2$ on the capping layer.

4. The method for fabricating thin film transistor according to claim 1,
wherein the heat treatment process comprises a first heat treatment process and a second heat treatment process.

5. The method for fabricating thin film transistor according to claim 4,
wherein the first heat treatment process is a process of performing heat treatment in the temperature range of 200 to 600° C., and the second heat treatment process is a process of performing heat treatment in the temperature range of 400 to 1300° C.

6. The method for fabricating thin film transistor according to claim 1,
wherein the capping layer is formed to thickness of 100 to 1500 Å.

7. The method for fabricating thin film transistor according to claim 1,
wherein the refraction index is proportional to a process power used in forming the capping layer and inversely proportional to a ratio of ammonia gas to silane gas used in forming the capping layer.

8. The method for fabricating thin film transistor according to claim 1, wherein the capping layer is a silicon nitride film.

9. The method for fabricating thin film transistor according to claim 1,
wherein during the heat treating, a portion of the metal catalyst layer moves through the capping layer to form a seed that is used to crystallize the amorphous silicon layer.

10. A method for fabricating thin film transistor comprising the steps of:
preparing an insulation substrate;
forming an amorphous silicon layer on the substrate;
forming a capping layer having 1.78 to 1.90 of a refraction index on the amorphous silicon layer;
forming a metal catalyst layer on the capping layer; and
crystallizing the amorphous silicon layer into a polycrystalline silicon layer by heat treating the substrate,
wherein during the heat treating, a portion of the metal catalyst layer moves through the capping layer to form a seed that is used to crystallize the amorphous silicon layer, and
wherein the heat treatment process comprises a first heat treatment process and a second heat treatment process.

11. The method for fabricating thin film transistor according to claim 10,
wherein the method further comprises the steps of removing the capping layer; forming a semiconductor layer by patterning the polycrystalline silicon layer; and forming a gate insulation film, a gate electrode, an interlayer insulation film and source/drain electrodes on the substrate after the step of crystallizing the amorphous silicon layer into the polycrystalline silicon layer by heat treating the substrate.

12. The method for fabricating thin film transistor according to claim 10,
wherein the step of forming the metal catalyst layer on the capping layer is a step of depositing one or more of metal catalysts selected from Ni, Pd, Ti, Ag, Au, Al, Sn, Sb, Cu, Co, Mo, Tr, Ru, Rh, Cd and Pt on the capping layer.

13. The method for fabricating thin film transistor according to claim 10,
wherein the step of forming the metal catalyst layer on the capping layer is a step of forming the metal catalyst layer to an areal density of $10^{11}$ to $10^{15}$ atoms/cm$^2$ on the capping layer.

14. The method for fabricating thin film transistor according to claim 10,
wherein the first heat treatment process is a process of performing heat treatment in the temperature range of 200 to 600° C., and the second heat treatment process is a process of performing heat treatment in the temperature range of 400 to 1300° C.

15. The method for fabricating thin film transistor according to claim 10,
wherein the capping layer is formed to thickness of 100 to 1500 Å.

16. The method for fabricating thin film transistor according to claim 10,
wherein the refraction index is proportional to a process power used in forming the capping layer and inversely proportional to a ratio of ammonia gas to silane gas used in forming the capping layer.

17. The method for fabricating thin film transistor according to claim 10,
wherein the capping layer is a silicon nitride film.

18. The method for fabricating thin film transistor according to claim 10,
wherein the first heat treatment process moves the seed to an interface of the capping layer and the amorphous silicon layer, and the second heat treatment process crystallizes the amorphous silicon layer into the polycrystalline silicon layer using the seed.

19. A method for fabricating thin film transistor comprising the steps of:
preparing an insulation substrate;
forming an amorphous silicon layer on the substrate;
forming a capping layer having 1.78 to 1.90 of a refraction index on the amorphous silicon layer;
forming a metal catalyst layer only on an upper surface of the capping layer; and
crystallizing the amorphous silicon layer into a polycrystalline silicon layer by heat treating the substrate,
wherein the refraction index is proportional to a process power used in forming the capping layer and inversely proportional to a ratio of ammonia gas to silane gas used in forming the capping layer.

20. The method for fabricating thin film transistor according to claim 19,
wherein during the heat treating, a portion of the metal catalyst layer moves through the capping layer to form a seed that is used to crystallize the amorphous silicon layer.

* * * * *

UNITED STATES PATENT AND TRADEMARK OFFICE
CERTIFICATE OF CORRECTION

PATENT NO. : 7,615,421 B2
APPLICATION NO. : 11/011585
DATED : November 10, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 892 days.

Signed and Sealed this

Fourteenth Day of December, 2010

David J. Kappos
*Director of the United States Patent and Trademark Office*